(12) United States Patent
Yoshie (10) Patent No.: US 6,449,740 B1
(45) Date of Patent: Sep. 10, 2002

(54) CONDUCTIVE PATHS CONTROLLABLY COUPLING PAD GROUPS ARRANGED ALONG ONE EDGE TO CPU AND TO EEPROM IN TEST MODE

(75) Inventor: Takeo Yoshie, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/365,909

(22) Filed: Aug. 3, 1999

(30) Foreign Application Priority Data

Aug. 5, 1998 (JP) ............................................ 10-221166

(51) Int. Cl.[7] .............................................. G06F 11/26
(52) U.S. Cl. ........................ 714/718; 710/38; 712/37; 712/38
(58) Field of Search .............................. 714/718, 733; 711/103; 712/37, 38; 710/38

(56) References Cited

U.S. PATENT DOCUMENTS 5,175,840 A * 12/1992 Swase et al. ............... 711/103
5,428,770 A * 6/1995 Garner ....................... 714/733
5,628,022 A * 5/1997 Ueno et al. .................. 712/37
5,991,232 A * 11/1999 Matsumura et al. ........ 365/233

FOREIGN PATENT DOCUMENTS

| JP | 55-63432 | 5/1980 |
| JP | 60-4233 | 1/1985 |
| JP | 2-189946 | 7/1990 |
| JP | 4-334042 | 11/1992 |
| JP | 5-47874 | 2/1993 |
| JP | 6-348866 | 12/1994 |

* cited by examiner

Primary Examiner—Kenneth S. Kim
(74) Attorney, Agent, or Firm—Hutchins, Wheeler & Dittmar (57) ABSTRACT

An EEPROM is incorporated in a single chip microcomputer for storing programmed instruction codes, and is tested before separation of a semiconductor wafer into semiconductor chips, wherein pads used in the EEPROM test are arranged along an edge of the semiconductor chip so as to permit an external tester to concurrently bring two rows of probes into contact therewith, thereby improving the testability.

22 Claims, 7 Drawing Sheets

CONDUCTIVE PATHS CONTROLLABLY COUPLING PAD GROUPS ARRANGED ALONG ONE EDGE TO CPU AND TO EEPROM IN TEST MODE

FIELD OF THE INVENTION

This invention relates to a single chip microcomputer and, more particularly, to a single chip microcomputer with a built-in EEPROM (Electrically Erasable and Programmable Read Only Memory).

DESCRIPTION OF THE RELATED ART

A central processing unit, a data memory, a program memory, a bus system and an interface are integrated on a single semiconductor chip, and is called as "single chip microcomputer". The program memory is usually implemented by a mask ROM (Read Only Memory), and programmed instructions are stored in the mask ROM during the fabrication of the single chip microcomputer. A semiconductor wafer is divided into narrow areas, and the narrow areas are respectively assigned to individual products of the single chip microcomputer. Deposition steps, patterning steps, doping steps and other well-known steps are repeated for the fabrication of the single chip microcomputer, and the manufacturer obtains semimanufactured products of the single chip microcomputer. The mask ROM is incomplete in the semimanufactured products. An array of filed effect transistors forms the mask ROM, and is formed in the semimanufactured product of the single chip microcomputer. The mask ROM is programmed through a selective channel doping. The field effect transistors are selectively doped with a dopant impurity. Selected field effect transistors are changed to the normally-on type through the doping, and the others remain in the normally-off type. These two kinds of field effect transistors are corresponding to the two logic levels, and store programmed instructions in the mask ROM. Thus, the single chip microcomputer is unity, and the mask ROM is not separable from the other components. Moreover, the programmed instructions are non-rewritable.

The single chip microcomputer has found a wide variety of application. The control of power unit in the automobile is a typical example of the application. The single chip microcomputer forms an essential component part of a controlling unit, and the controlling unit is installed into the automobile. The single chip microcomputer sequentially executes the programmed instructions stored in the program memory, and controls the fuel injection, the revolution of the engine and so forth. A bug is not avoidable from the programmed instructions stored in the mask ROM. After the installation of the control unit into an automobile, the bug may be found. The automobile manufacturer announces the obligation to replace the control unit with a new one to the user. As described hereinbefore, the programmed instructions are non-rewritable, and the mask ROM is not separable from the single chip microcomputer. This means that the automobile manufacturer is to change the control unit with a new one. The replacement is a great expense.

In order to reduce the loss, the semiconductor manufacturer replaces the mask ROM with an EEPROM (Electrically Erasable and Programmable Read Only Memory). The EEPROM includes addressable memory cells, and the addressable memory cell is implemented by a floating gate type field effect transistor. When the manufacturer stores the programmed instructions into the memory cell array, electrons are selectively accumulated in the floating gates of the memory cells, and, accordingly, change the threshold of the selected memory cells. The high threshold and the low threshold are corresponding to the two logic levels, and the programmed instructions are stored in the form of different threshold in the memory cell array of the EEPROM.

The programmed instructions are erasable, new programmed instructions are stored in the memory cell array of the EEPROM. When the accumulated electrons are evacuated from the floating gates of the memory cells, the programmed instructions are erased from the memory cell array. After the erasing, electrons are selectively accumulated in the floating gates of the memory cells, again, and a set of new programmed instructions is stored in the memory cell array of the EEPROM. Although the program memory implemented by the EEPROM is not separable from the single chip microcomputer, the programmed instructions are rewritable. If a bug is found, the automobile manufacturer only rewrites the programmed instructions stored in the EEPROM, and the repairing work is not so expensive. For this reason, the single chip microcomputer with built-in EEPROM is in great demand.

The single chip microcomputer with built-in EEPROM has been improved in data processing capability, and a large program memory and a large data memory are required for complicated jobs. The data bus has been changed from 4 bits through 8 bits and 16 bits to 32 bits. The address lines have been also increased to 12 bits–32 bits, and the data storage capacity of the EEPROM is 1 kilobyte to 100 kilobytes. Thus, a large EEPROM is incorporated in the single chip microcomputer for the programmed instructions.

Upon completion of the fabrication process, the manufacturer checks the products to see whether or not all the components are operable without any trouble. The single chip microcomputer supplies an address signal from the central processing unit to the program memory, and the programmed instruction is supplied from the program memory to the central processing unit. Thus, the address signal and the programmed instruction are internally propagated between the components, and are not taken out from the single chip microcomputer. For this reason, the manufacturer tests the products before separation from the semiconductor wafer into the chips.

It is possible to carry out tests for the central processing unit, the random access memory, the interfaces/input/output ports and the timer within a short time. However, the test on the EEPROM consumes a long time. This is because of the fact that the injection of electron into a floating gate and the evacuation of electron therefrom are time-consuming. The testing system requires several milliseconds for each EEPROM cell, and the total time period for the EEPROM cell array is tens minutes. A semiconductor wafer is shared between products of the single chip microcomputer, and several hours are consumed for the tests on each semiconductor wafer. This results in low productivity. In the following description, the semiconductor chips before the separation of the semiconductor wafer are referred to as "semiconductor areas".

The EEPROM is tested as follows. The first method is a diagnosis by using a built-in test circuit. The test circuit is integrated on the semiconductor area together with the other components during the fabrication process. The test circuit sequentially addresses the EEPROM cells, and writes a test pattern into the EEPROM cells. Thereafter, the test circuit reads out the test pattern, and compares the read-out test pattern with the write-in test pattern to see whether or not the EEPROM cells have maintained the test pattern without inversion of a test bit. When the read-out test pattern is consistent with the write-in test pattern, the test circuit outputs a diagnostic signal representative of the diagnosis.

A built-in test program is used in the second method. The central processing unit sequentially fetches the programmed instructions for the test, and executes the programmed instructions for generating an address signal and a test pattern. The address signal is supplied to the EEPROM cells so as to sequentially select the EEPROM cells from the cell array. The test pattern is written into the selected EEPROM cells. Upon completion of the write-in, the central processing unit sequentially addresses the EEPROM cells, and the test pattern is read out from the EEPROM cells. The read-out test pattern is compared with the write-in test pattern to see whether or not the EEPROM cells have maintained the test pattern without inversion of a test bit. When the read-out test pattern is consistent with the write-in test pattern, the central processing unit diagnoses the EEPROM cells as non-defective.

The third method is a diagnosis by using an external testing system. The testing system is equipped with a probe card, and the probe card has a lot of probes. On the other hand, the single chip microcomputer has additional input/output ports for the test. The testing system advances the probe card toward the semiconductor wafer, and the probes are brought into contact with the input/output ports in a selected semiconductor area. The testing system supplies an address signal and a test pattern through the probes and the input/output port to the address lines and the data bus in the selected semiconductor area, and the test pattern is written into the EEPROM cells. Then, the test pattern is read out from the EEPROM cells through the input/output port to the testing system, and the testing system checks the read-out test pattern to see whether or not the EEPROM cells have maintained the test pattern without inversion of a test bit. When the read-out test pattern is consistent with the write-in test pattern, the testing system diagnoses the EEPROM cells as non-defective.

The first method and the second method are not reliable, because a defective built-in test circuit and a program sequence with a bug make a wrong diagnosis. The third method seldom makes the wrong diagnosis. However, the additional input/output ports are required for the third method. The address code and the instruction code have been increased in width. A built-in EEPROM is addressed with a sixteen-bit address signal, and the instruction code consists of thirty-two bits. The testing system requires the additional input/output ports consisting of a large number of communication pads, and the manufacturer feels the assignment of the large number of pads to the additional input/output ports difficult. This is the first problem inherent in the third testing method.

Another problem is difficulty in parallel test. As described hereinbefore, the test on the single chip microcomputer with the built-in EEPROM is time-consuming, and a parallel test for plural semiconductor areas is desirable. However, there is a limit on the probes. A standard testing system is communicable with only two hundred and fifty-six probes, and the probes are formed in a circular area of ten to fifteen centimeters in diameter. The testing system is expected to concurrently communicate with the input/output ports formed in the adjacent semiconductor areas during the parallel test. The communication pads are laid out on the same pattern in every semiconductor area. The manufacturer needs to supply the same signals to the corresponding communication pads, and complicatedly arranges the probes on the probe card across the boundary between the adjacent semiconductor areas. Thus, the parallel test is less feasible on the semiconductor wafer.

Figure 1:
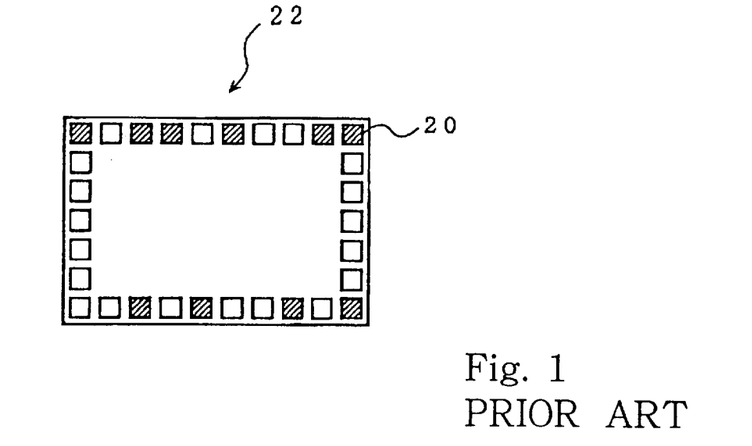
FIG. 1 is a plane view showing the probe card disclosed in Japanese Patent Publication of Unexamined Application No. 2-189946.
Figure 2:
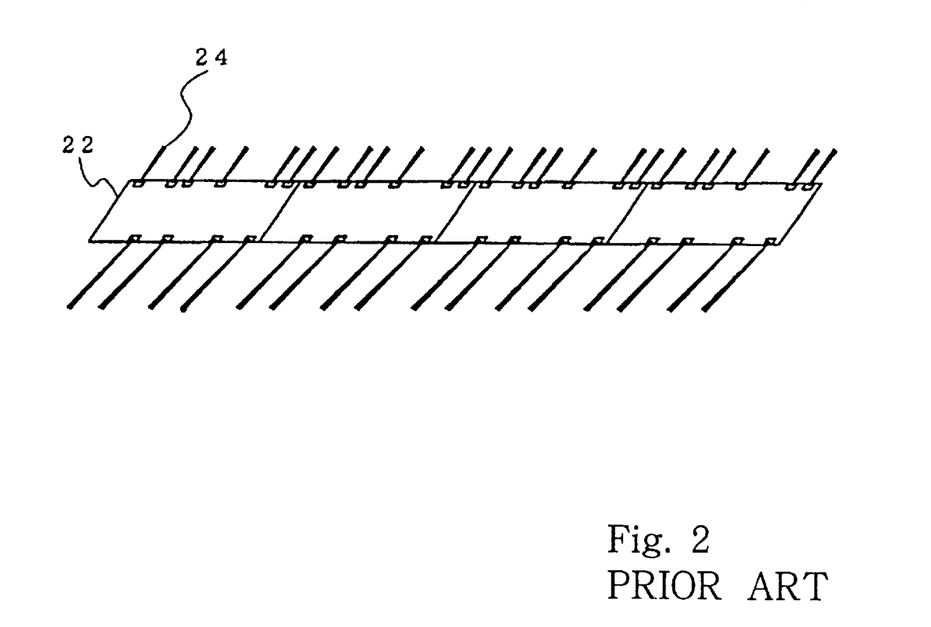
FIG. 2 is a perspective view showing the four semiconductor chips concurrently subjected to the test.

A probe card is proposed in Japanese Patent Publication of Unexamined Application No. 2-189946. The Japanese Patent Publication of Unexamined Application proposes to arrange the communication pads 20 for the test along two edges of a semiconductor chip 22 as shown in FIG. 1 of the drawings. The communication pads 20 for the test are indicated by hatching lines for discrimination from the other pads. A testing system can concurrently communicate with plural semiconductor chips 22 as shown in FIG. 2, because the probes 24 of the probe card are laid out in parallel without any crossing. Although the arrangement of pads and the probe card allow the testing system to carry out the parallel test, the testing system is merely communicable with the semiconductor chips arranged in a single row, and the length of the probe card sets a limit on the number of semiconductor chips to be concurrently tested.

SUMMARY OF THE INVENTION

It is therefore an important object of the present invention to provide a single chip microcomputer with a built-in EEPROM, which permits a testing system to concurrently test products more than those of the semiconductor chips tested in the Japanese Patent Publication of Unexamined Application.

The present inventor contemplated the problem, and noticed that a probe card was available for two rows of products if the communication pads of each product were arranged along a single edge of the semiconductor chip 22.

The present inventor was able to arrange the communication pads for the EEPROM test along a single edge in so far as the storage capacity of the EEPROM was relatively small. However, when the storage capacity was increased, it was difficult to arrange the communication pads along a single edge. In detail, a single chip microcomputer had thirteen 8-bit input/output ports, and the built-in EEPROM communicated with the central processing unit through a 32-bit address bus and a 16-bit data bus. A hundred and sixty communication pads were formed along the periphery of the single chip microcomputer, and forty pads were arranged along each edge of the semiconductor chip. This meant that the communication pads for the EEPROM test were limited to forty. The testing system required sixteen data lines, thirty-two address lines, two power supply lines and at least five control signal lines for the EEPROM test. The total number of communication pads to be required was at least fifty-five. Sixty communication pads were preferable for the EEPROM test. The present inventor concluded that a multiple usage of the communication pads resulted in the single row of communication pads for the large EEPROM.

In accordance with one aspect of the present invention, there is provided a single chip microcomputer fabricated on a semiconductor chip, having a data processing mode and a test mode and comprising a central processing unit executing programmed instructions expressing at least one job in the data processing mode, an electrically erasable and programmable read only memory storing pieces of information used in the data processing mode for the central processing unit and tested to see whether the pieces of information are properly maintained in the test mode, plural communication pads classified into a first communication pad group used only for the job in the data processing mode and a second communication pad group available for the test in the test mode and arranged along an edge of the semiconductor chip and plural conductive paths selectively connected between the plural communication pads, the central processing unit and the electrically erasable and programmable read only memory.

BRIEF DESCRIPTION OF THE DRAWINGS

The features and advantages of the single chip microcomputer with a built-in EEPROM will be more clearly understood from the following description taken in conjunction with the accompanying drawings in which.

DESCRIPTION OF THE PREFERRED EMBODIMENTS

First Embodiment
  Arrangement of Components

Figure 3:
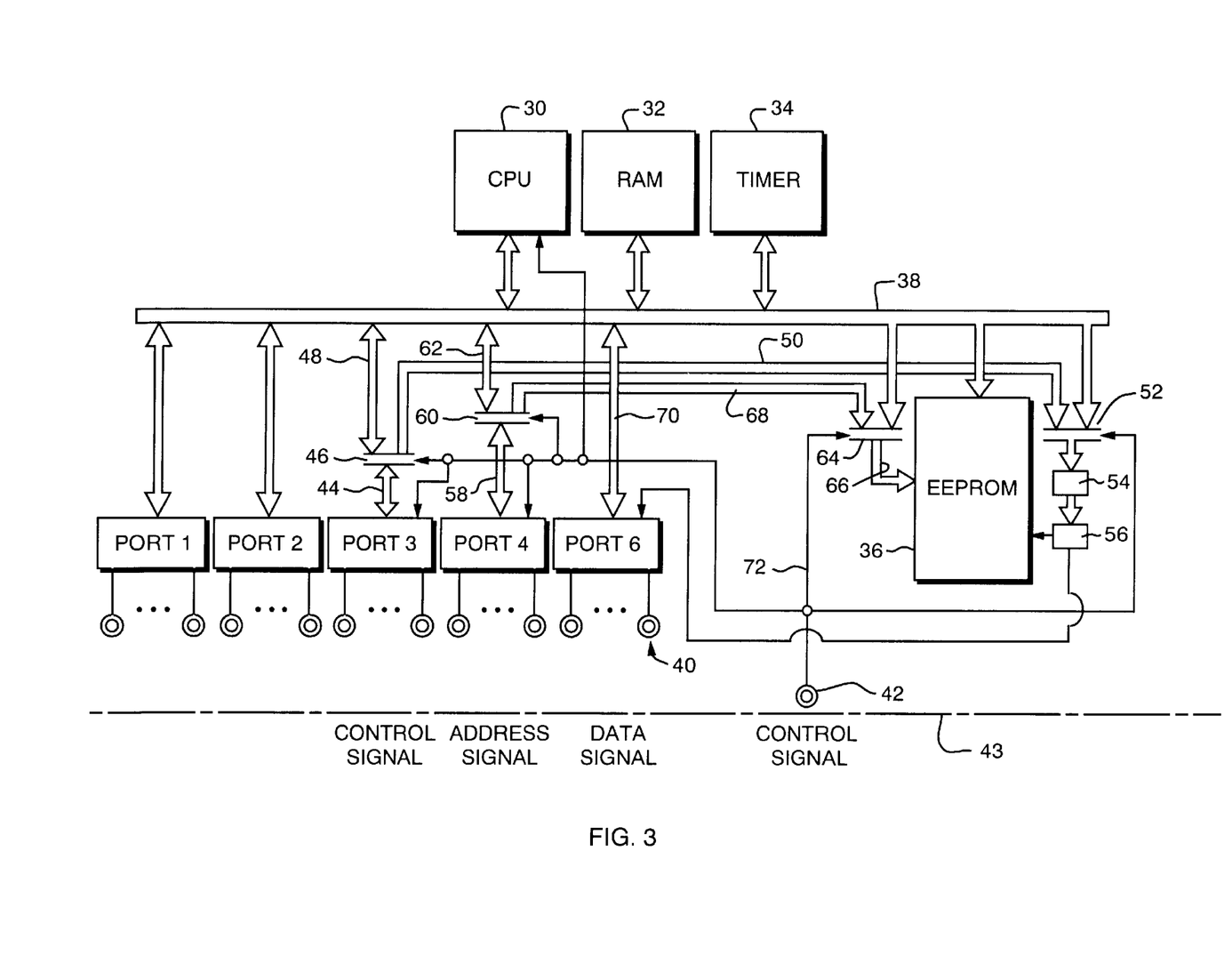
FIG. 3 is a block diagram showing the arrangement of essential components incorporated in a single chip microcomputer according to the present invention.

Referring to FIG. 3 of the drawings, a single chip microcomputer embodying the present invention comprises a central processing unit 30, a random access memory 32, a timer 34, a flush type EEPROM (Electrically Erasable and Programmable Read Only Memory) 36 and a shared data bus system 38. The central processing unit 30 and the random access memory 32 are abbreviated as "CPU" and "RAM", respectively, and are connected to the shared bus system 38. The random access memory 32 is mainly used as a data memory, and programmed instructions are stored in the EEPROM 32. The storage capacity of the EEPROM 36 is relatively small. An address signal, a data signal and an instruction signal are propagated through the shared bus system 38. The single chip microcomputer enters "test mode" for the EEPROM 32, and sequentially executes the programmed instruction for given tasks in "data processing mode".

The single chip microcomputer further comprises input/output ports PORT1, PORT2, PORT3, PORT4 and PORT6, and communication pads 40 are selectively connected to the input/output ports PORT1 to PORT6. Though not shown in FIG. 3, the pads 40 are electrically connected to signal pins. The input/output ports PORT1 and PORT2 are used for communication with other system components in the data processing mode. Although more than two input/output ports are prepared for the communication with the other system components, only two input/output ports PORT1/PORT2 are shown in FIG. 3.

The input/output ports PORT3, PORT4 and PORT6 serve as general-purpose ports, and are available for the EEPROM test. The input/output ports PORT3, PORT4 and PORT6 are electrically connected to other communication pads 40, which in turn are connected to signal pins (not shown). Signals are transferred between the system components and the input/output ports PORT3, PORT4 and PORT6 through the signal pins in the data processing mode. However, an external tester (not shown) supplies a control signal indicative of an operation sub-mode through the communication pads 40 to the input/output port PORT3 in the test mode. The single chip microcomputer is responsive to the control signal so as to make the EEPROM selectively enter a write-in sub-mode, a verify/read-out sub-mode and an erase sub-mode.

The input/output port PORT4 is assigned to an address signal. The external tester (not shown) supplies the address signal through the communication pads 40 to the input/output port PORT4 so as to specify a memory location in the EEPROM 36. The input/output port PORT6 is assigned to a data signal, and the data signal is transferred through the communication pads 40 and the input/output port PORT6 between the external tester (not shown) and the EEPROM 36.

A test pad 42 is assigned a control signal representative of a mode change, and the control signal changes the single chip microcomputer between the test mode and the data processing mode. The test pad 42 is connected to a signal pin (not shown), and the external tester supplies the control signal to the test pad 42. The test pad 42 and the communication pads 40 connected to the input/output ports PORT3, PORT4 and PORT6 are arranged along one edge 43 of a semiconductor chip.

The single chip microcomputer further comprises a set of signal lines 44, a selector 46, a set of signal lines 48 and a set of signal lines 50. The input/output port PORT3 is connected through the set of signal lines 44 to the selector 46, and the sets of signal lines 48 and 50 are connected to the selector 46. The set of signal lines 48 connects the selector to the shared bus system 38. The selector 46 is responsive to the control signal at the test pad 42 so as to connect the set of signal lines 44 to the set of signal lines 50 or the other set of signal lines 48. While the single chip microcomputer is running in the data processing mode, the control signal at the test pad 42 is in an inactive level, and the selector 46 connects the set of signal lines 44 through the set of signal lines 48 to the shared bus system 38. When the control signal at the test pad 42 is changed from the inactive level to an active level, the selector 46 connects the set of signal lines 44 to the other set of signal lines 50.

The single chip microcomputer further comprises a selector 52, a register 54 and a decoder 56. The set of signal lines 50 and the shared bus system 38 are connected to the selector 52, and the selector 52 is responsive to the control signal at the test pad 42 so as to selectively connect the set of signal lines 50 and the shared bus system 38 to the register 54. The decoder 56 is further connected to the input/output port PORT6.

When the control signal at the test pad 42 is indicative of the test mode, the selector 52 connects the set of signal lines 50 to the register 54. Thus, the selectors 46 and 52 transfer the control signal indicative of the operation submode from the input/output port PORT3 to the register 54 in the test mode. The control signal is temporarily stored in the register 54, and is decoded by the decoder 56. The decoded signals are supplied to a control port of the EEPROM 36, and the designated operation sub-mode is established in the EEPROM 36. The EEPROM 36 further has a data port, and the shared bus system 38 is directly connected to the data port of the EEPROM 36.

The single chip microcomputer further comprises a set of signal lines 58, a selector 60, a set of signal lines 62, a selector 64 and two sets of signal lines 66 and 68. The input/output port PORT4 is connected through the set of signal lines 58 to the selector 60, and the selector 60 is responsive to the control signal at the test pad 42 so as to selectively connect the set of signal lines 58 to the set of signal lines 62 and the set of signal lines 68. The set of signal lines 62 is connected to the shared bus system 38, and the other set of signal lines 68 is connected to the other selector 64. The shared bus system 38 is further connected to the selector 64, and the selector 64 is responsive to the control signal at the test pad 42 so as to connect the set of signal lines 68 through the set of signal lines 66 to an address port of the EEPROM 36. Thus, the selectors 60 and 64 transfer the external address signal from the input/output port PORT4 to the address port of the EEPROM 36.

The single chip microcomputer further comprises a set of signal lines 70 and a signal line 72. The input/output port PORT6 is connected through the set of signal lines 70 to the shared bus system 38. As described hereinbefore in connection with the decoder 56, the decoder 56 is further connected to the input/output port PORT6, and the decoded signal is supplied from the decoder 56 to the input/output port PORT6. The decoded signal makes the input/output port PORT6 transfer a signal from the communication pads 40 to the shared bus system 38 and vice versa.

The signal line 72 is connected to the control nodes of the selectors 46, 52, 60, 64, the control nodes of the input/output ports PORT3 and PORT4 and a control node of the central processing unit 30. The control signal indicative of the operation mode is supplied from the test pad 42 to the selectors 46, 52, 60 and 64, the input/output ports PORT3/PORT4 and the central processing unit 30.

The selectors 46, 52, 60 and 64 change the connections as described hereinbefore. The control signal at the test pad 42 changes the central processing unit 30 between active and inactive. When the control signal at the test pad 42 is indicative of the data processing mode, the central processing unit 30 is active, and executes the programmed instructions for given tasks. On the other hand, the central processing unit 30 becomes inactive in the presence of the control signal indicative of the test mode. The control signal changes the input/output ports PORT3 and PORT4 between a signal transfer from the communication pads 40 and a signal transfer to the communication pads 40. When the control signal at the test pad 42 is indicative of the test mode, the input/output ports PORT3 and PORT4 transfer the control signal and the address signal from the communication pads 40 to the associated selectors 46 and 60.

EEPROM Test

Description is hereinbelow made on the outline of the EEPROM test with reference to FIG. 3. Upon completion of the fabrication process for the single chip microcomputer, products of the single chip microcomputer are obtained in narrow semiconductor areas arranged in matrix on a semiconductor wafer, respectively. When the semiconductor wafer is broken into semiconductor chips, the narrow semiconductor areas are corresponding to the semiconductor chips. The semiconductor wafer is conveyed to an external tester (not shown), and probes of a card (not shown) are brought into contact with the communication pads 40 of the products in at least two rows of semiconductor areas. As described hereinbefore, the communication pads 40 for the input/output ports PORT3, PORT4 and PORT6 and the test pad 42 are arranged along the boundary between the adjacent semiconductor areas, i.e., the edge 43, and the probes are connectable to the communication pads 40 and the test pads 42 of the products in the two rows. Thus, the external tester is communicable with the plural products through the probe card. However, the EEPROM test is outlined for one of the products for the sake of simplicity.

The external tester supplies the control signal indicative of the test mode to the test pad 42, and the control signal is distributed to the input/output ports PORT3 and PORT4, the central processing unit 30 and the selectors 46, 52, 60 and 64. The central processing unit 30 becomes inactive, and the input/output ports PORT3 and PORT4 make ready to transfer signals from the communication pads 40 to the associated selectors 46 and 60. The selectors 46 and 52 select the set of signal lines 50, and the selectors 60 and 64 select the set of signal lines 68. Thus, the input/output port PORT3 is connected through the selector 46, the set of signal lines 50 and the selector 52 to the register 52, and the input/output port PORT4 is connected through the selector 60, the set of signal lines 68, the selector 64 and the set of signal lines 66 to the address port of the EEPROM 36.

The external tester supplies the control signal indicative of the write-in sub-mode through the communication pads 40 to the input/output port PORT3. The control signal is propagated from the input/output port PORT3 to the register 54, and is stored therein. The decoder 56 generates the decoded signals from the control signal, and supplies the decoded signals to the control port of the EEPROM 36 and the input/output port PORT6. The decoded signals establish the write-in sub-mode in the EEPROM 36, and make the input/output port PORT6 ready to transfer the data signal through the set of signal lines 70 to the shared bus system 38.

Subsequently, the external tester supplies the address signal indicative of an address location and the data signal representative of a test pattern to the input/output ports PORT3 and PORT4. The address signal is propagated through the set of signal lines 44, the selector 58, the selector 60, the set of signal lines 68, the selector 64 and the set of signal lines 66 to the address port of the EEPROM 36, and makes the EEPROM 36 to connect the data port to the memory cells at the memory location. On the other hand, the data signal is propagated through the set of signal lines 70 and the shared bus system 38 to the data port of the EEPROM 36, and the test pattern is written into the memory cells at the designated location.

Subsequently, the external tester supplies the control signal indicative of the verify/read-out sub-mode to the input/output port PORT3. The control signal is transferred to the register 54, and is decoded by the decoder 56. The decoded signals establish the verify/read-out sub-mode in the EEPROM 36, and makes the input/output port PORT6 ready to transfer a data signal from the set of signal lines 70 to the associated communication pads 40.

The external tester supplies the address signal to the input/output port PORT4, and the address signal is transferred to the address port of the EEPROM 36. An internal sense amplifier flows current to the memory cells at the memory location, and checks the potential level on the current path to see whether or not the memory cells flow the current to a discharge line. If the test pattern has changed a selected memory cell to a high threshold, the selected memory cell does not offer any conductive channel, and no current flows. For this reason, the current path keeps the potential level high. On the other hand, if the test pattern has changed the selected memory cell to a low threshold, the selected memory cell offers a conductive channel between the current path and the discharge line, and discharges the current. This results in that the current path decays the potential level. Test bits of the test pattern are stored in the memory cells in the form of the threshold, and the sense amplifier discriminates the stored bits on the basis of the potential level on the current path. The sense amplifier produces output data signal indicative of the read-out test pattern, and the output data signal is supplied from the data port through the shared bus system 38, the set of signal lines 70, the input/output port PORT6 and the communication pads 40 to the external tester. The external tester compares the read-out test patter with the write-in test pattern to see whether or not the memory cells maintain the test pattern without inversion of a test bit. The above-described sequence is repeated for all the memory cells, and the external tester diagnoses the EEPROM 36 as either defective or non-defective.

Subsequently, the external tester supplies the control signal indicative of the erasing sub-mode to the input/output port PORT3. The control signal is propagated to the register 54, and is decoded by the decoder 56. The decoded signals establish the EEPROM 36 in the erasing sub-mode, and keeps the input/output port PORT6. The accumulated electrons are evacuated from the floating gate electrodes of all the memory cells, and the test pattern is erased from the memory cell array.

Finally, the external tester supplies the control signal indicative of the verify/read-out mode to the input/output port PORT3, again, and supplies the address signal to the input/output port PORT4. The sense amplifier sequentially checks the memory cells to see whether or not the threshold returns to the initial state. The EEPROM 36 reports the results through the data signal, and the external tester confirms the current state of the memory cells. If the test patter is left in a part of the memory cell array, the external tester may repeat the erasing operation.

As will be appreciated from the foregoing description, the manufacturer arranges the communication pads 40/41 for the EEPROM test along the single edge 43 of the semiconductor chip, and the external tester brings the two rows of probes into contact with the communication pads of the products arranged in two rows on the semiconductor wafer. This results in that the external tester concurrently diagnoses the products twice as many as those disclosed in the Japanese Patent Publication of Unexamined Application. Thus, the single chip microcomputer according to the present invention enhances the testability, and reduces the production cost by virtue of the parallel diagnosis.

Second Embodiment

Arrangement of Components

Figure 4:
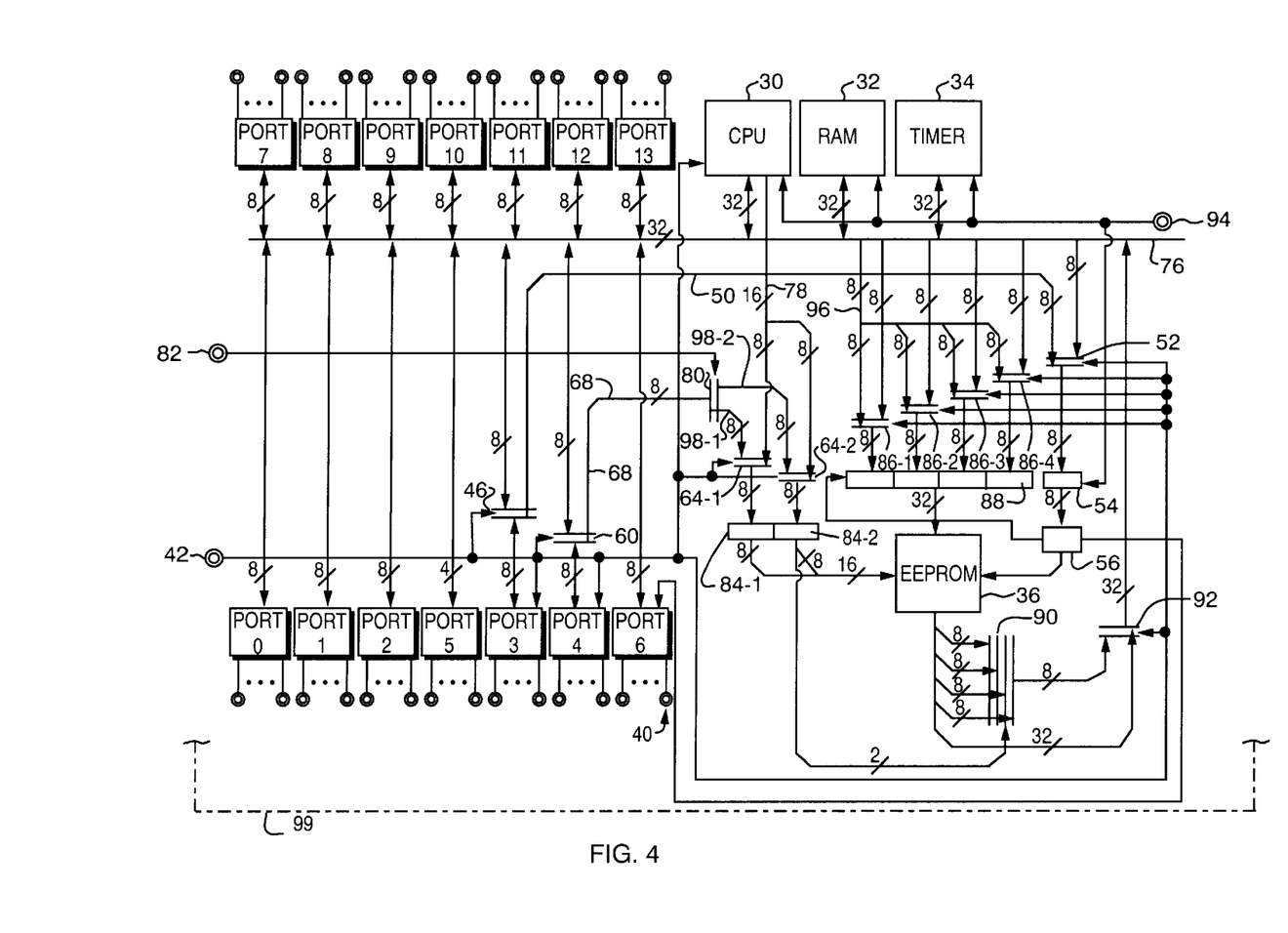
FIG. 4 is a block diagram showing the arrangement of essential components incorporated in another single chip microcomputer according to the present invention.

FIG. 4 illustrates another single chip microcomputer embodying the present invention. Components corresponding to those of the first embodiment are labeled with the same references. However, the EEPROM 36 is larger in storage capacity than that of the first embodiment. A 32-bit data bus 76 and a 16-bit address bus 78 are incorporated in the single chip microcomputer, and fourteen input/output ports PORT0, PORT1, PORT2, PORT3, PORT4, PORT5, PORT6, PORT7, PORT8, PORT9, PORT10, PORT11, PORT12 and PORT13 are provided for communication with external devices. A numeral on the left side of a slash mark is indicative of the number of signal bits propagated through the bus or a set of signal lines. The fourteen input/output ports PORT0 to PORT13 are available for the communication in the data processing mode.

The input/output ports PORT3, PORT4 and PORT6 are assigned to the control signal indicative of the operation sub-mode, the address signal and the data signal in the EEPROM test. Although sixteen address bits form the address signal, the input/output port PORT4 is connected through the eight signal lines to the selector 60. In this instance, the eight address bits are twice transferred from the external tester to the input/output ports PORT4. For this reason, additional components are inserted between the set of signal lines 68 and the address port of the EEPROM 36, and the selector 64 is replaced with two selectors 64-1 and 64-2.

The first additional component is a selector 80. The selector 80 is connected between the set of signal lines 68 and the two selectors 64-1 and 64-2, and two sets of signal lines 98-1 and 98-2 are connected between the selector 80 and the two selectors 64-1 and 64-2. The selector 80 is responsive to a control signal at a communication pad 82 so as to selectively connect the set of signal lines 68 to the selector 64-1 through the set of signal lines 98-1 and the other selector 64-2 through the set of signal lines 98-2.

The second additional component is two eight-bit address registers 84-1 and 84-2. The selector 64-1 is connected to the eight-bit address register 84-1, and the other selector 64-2 is connected to the other eight-bit address register 84-2. The two address registers 84-1 and 84-2 are connected to the address port of the EEPROM 36.

The external tester firstly supplies the control signal indicative of the selector 64-1 to the selector 80, and supplies the eight address bits to the input/output port PORT4. The eight address bits are transferred through the selector 80 to the selector 64-1, which in turn transfers the eight address bits to the eight-bit address register 84-1. Subsequently, the external tester changes the control signal so as to indicate the other selector 64-2. The remaining eight address bits are transferred through the selector 80 to the other selector 64-2, which in tern transfers the remaining eight address bits to the other eight-bit address register 84-2. As a result, the sixteen-bit address signal is stored in the address registers 84-1 and 84-2, and is supplied from the address registers 84-1 and 84-2 to the address port of the EEPROM 36. The eight-address bits are twice transferred to the address registers 84-1 and 84-2. This feature is desirable for the EEPROM test, because only eight communication pads 40 are required f or the addressing.

The input/output port PORT6 receives eight data bits, and the EEPROM has a 32-bit input data port and a 32-bit output data port. For this reason, additional components are also inserted into the data propagation paths. The first additional component is four selectors 86-1, 86-2, 86-3 and 86-4 and four eight-bit data buffers 88 connected between the four selectors 86-1, 86-2, 86-3 and 86-4 and the input data port of the EPROM 36. The data bus 76 has thirty-two data signal lines. Eight data signal lines selected from the data bus 76 are connected to the first input ports of the four selectors 86-1, 86-2, 86-3 and 86-4. The thirty-two data signal lines are divided into four groups each consisting of eight data signal lines, and the four data signal line groups are respectively connected to the second input ports of the selectors 86-1, 86-2, 86-3 and 86-4. The selectors 86-1, 86-2, 86-3 and 86-4 are responsive to the control signal at the test pad 42 so as to selectively connect the first input ports and the second input ports to the data buffers 88. On the other hand, the data buffers 88 are responsive to the decoded signal so that the data buffers 88 are changed between a data write-in and a data read-out.

The second additional component is selectors 90 and 92 connected in series between the 32-bit output data port of the EEPROM 36 and the 32-bit data bus 76. The 32-bit output data port is directly connected to the first input port of the selector 92, and is further connected to four eight-bit input ports of the select or 90. The eight-bit out put port of the selector 90 is connected to the second input port of the selector 92. A two-bit control signal is supplied from the address register 84-2 to the control port of the selector 90 so that the selector 90 selectively connects the four eight-bit input ports to the second input port of the other selector 92. The selector 92 is responsive to the control signal at the test pad 42 so as to selectively connect the first input port and the second input port to the data bus 76.

A communication pad 94 is assigned to a clock signal, and the clock signal is supplied to the clock port of the central processing unit 30, the clock port of the random access memory 32, the clock port of the timer 34 and a clock port of the register 54. The communication pads 40 connected to the input/output ports PORT3, PORT4 and PORT6, the communication pad 82 and the test pad 42 are required for the EEPROM test, and, for this reason, are arranged along an edge 99 of the semiconductor chip. Thus, only twenty-six pads 40/42 and 82 are used in the EEPROM test.

EEPROM Test

The single chip microcomputer is tested before sealing in a package. Products of the single chip microcomputer are arrayed on a semiconductor wafer. An external tester has a probe card like the probe card shown in FIG. 2, and the probes are concurrently brought into contact with the pads 40/42 and 82 of the products arranged in two rows on the semiconductor chip. The EEPROM test proceeds as follows.

Figure 5:
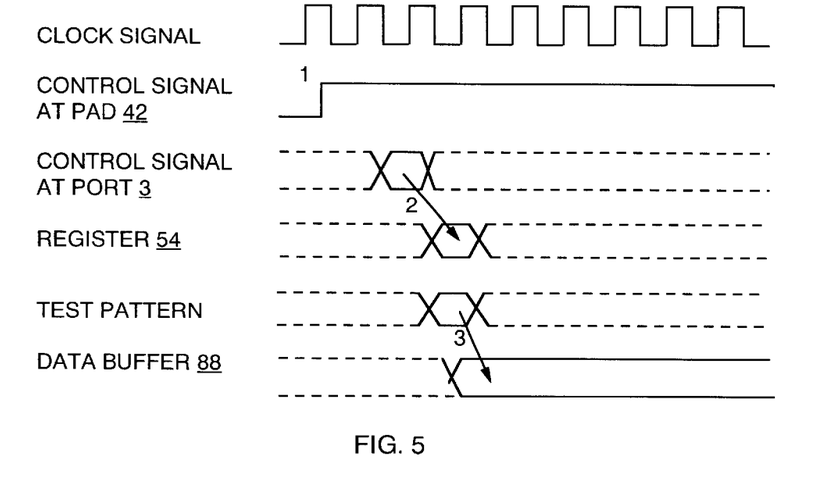
FIG. 5 is a timing chart showing a transfer of a test pattern to a register.

First, the external tester stores a test pattern in the data buffer 88. FIG. 5 illustrates the data transfer to the data buffer 88. The external tester changes the control signal at the test pad 42 to a high level as indicated by reference numeral 1 enclosed with a circle, and the high level is indicative of the EEPROM test. Then, the central processing unit 30 becomes inactive. The input/output port PORT3 is made ready to receive the control signal from the external tester. The selectors 46 and 52 select the set of signal lines 50, the selector 60 selects the set of signal lines 68, and the selectors 86-1, 86-2, 86-3 and 86-4 select the set of signal lines 96.

Subsequently, the external tester supplies the control signal indicative of the write-in sub-mode to the input/output port PORT3 as indicated by reference numeral 2 enclosed with a circle. The control signal is propagated through the selector 46, the set of signal lines 50 and the selector 52 to the register 54, and is written thereinto. The control signal is decoded, and the decoded signals are supplied to the EEPROM 36, the data buffer 88 and the input/output port PORT6. The decoded signals establish the write-in submode in the EEPROM 36, makes the input/output port PORT6 ready to receive the data signal from the external tester, and make the data buffers 86-1, 86-2, 86-3 and 86-4 ready to store the data signal.

Subsequently, the external tester supplies the 8-bit data signal representative of a test pattern to the input/output port PORT6. The 8-bit data signal is transferred through the data bus 76, the set of signal lines 96 and the selectors 86-1, 86-2, 86-3 and 86-4 to the data buffers 88, and is stored in the four 8-bit data buffers 88. As a result, the test pattern is stored in each of the 8-bit data buffers 88.

Figure 6:
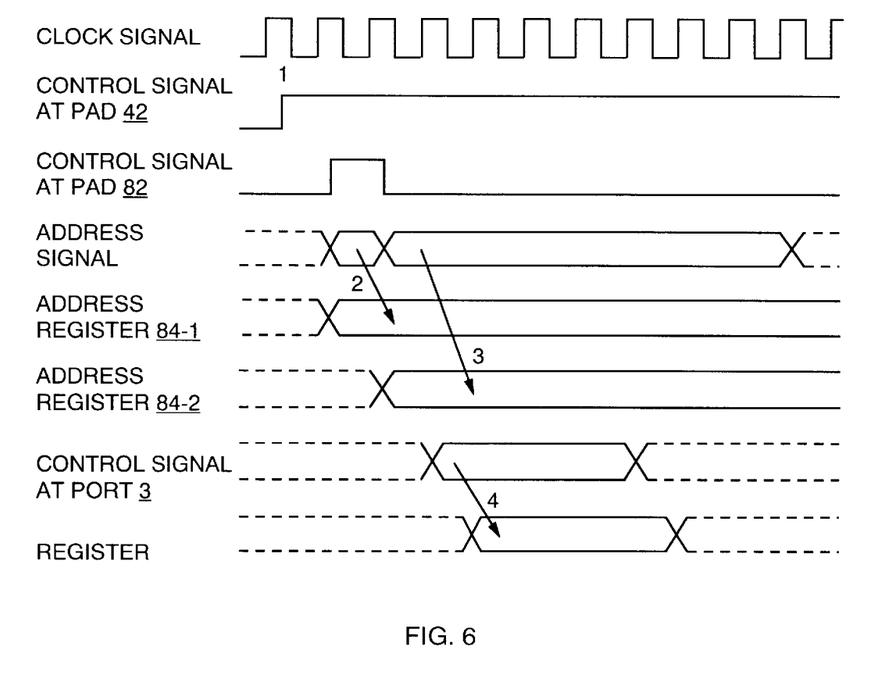
FIG. 6 is a timing chart showing a write-in operation of the test pattern into a memory location.

Subsequently, the external tester instructs the single chip microcomputer to write the test pattern into the memory cells. FIG. 6 illustrates the write-in sequence. The external tester changes the control signal at the test pad 42 to the high level as indicated by reference numeral 1 enclosed with a circle. Then, the central processing unit 30 becomes inactive. The input/output ports PORT3 and PORT4 are made ready to receive the control signal and the address signal from the external tester. The selector 60 selects the set of signal lines 68, and the selectors 64-1 and 64-2 select the sets of signal lines 98-1 and 98-2. The selectors 46 and 52 maintain the set of signal lines 50.

The external tester changes the control signal at the communication pad 82 to the high level. Then, the selector 80 is responsive to the control signal at the communication pad 82 so as to connect the set of single lines 68 to the set of signal lines 98-1. The external tester supplies the eight-bit address signal representative of a higher part of an address to the input/output port PORT4, and the eight-bit address signal is transferred through the selector 60, the set of signal lines 68, the selector 80, the set of signal lines 98-1 and the selector 64-1 to the address register 84-1. The eight-bit address signal is stored in the address register 84-1 as indicated by reference numeral 2 enclosed with a circle.

Subsequently, the external tester changes the control signal at the communication pad 82 to a low level. The selector 80 is responsive to the control signal at the communication pad 82 so as to connect the set of signal lines 68 to the other set of signal lines 98-2. The external tester supplies the eight-bit address signal representative of a lower part of the address to the input/output port PORT4, and the eight-bit address signal is transferred through the selector 60, the set of signal lines 68, the selector 80, the set of signal lines 98-2 and the selector 64-2 to the address register 84-2. The eight-bit address signal is stored in the address register 84-2 as indicated by reference numeral 3 enclosed with a circle.

The external tester supplies the control signal indicative of the write-in sub-mode to the input/output port 46, and the control signal is transferred through the selector 46, the set of signal lines 50 and the selector 52 to the register 54, and is stored therein as indicated by reference numeral 4 enclosed with a circle. The control signal is decoded, and the decoded signals establish the write-in sub-mode in the EEPROM. The decoded signal instructs the data buffers 88 to supply the test patterns to the input data port of the EEPROM 36. The test patterns are written into the memory cells assigned the address identical with the address stored in the address registers 84-1 and 84-2.

The external tester sequentially increments the lower part of the address by four, and the test patterns are concurrently written into the selected memory cells. When the lower part of the address reaches FFH, the external tester changes the control signal at the communication pad 82 to the high level, and increment the higher part of address by one. The external tester changes the control signal at the communication pad 82 to the low level, and sequentially increments the lower part of address. Finally, the test patterns are written into all the memory cells.

Figure 7:
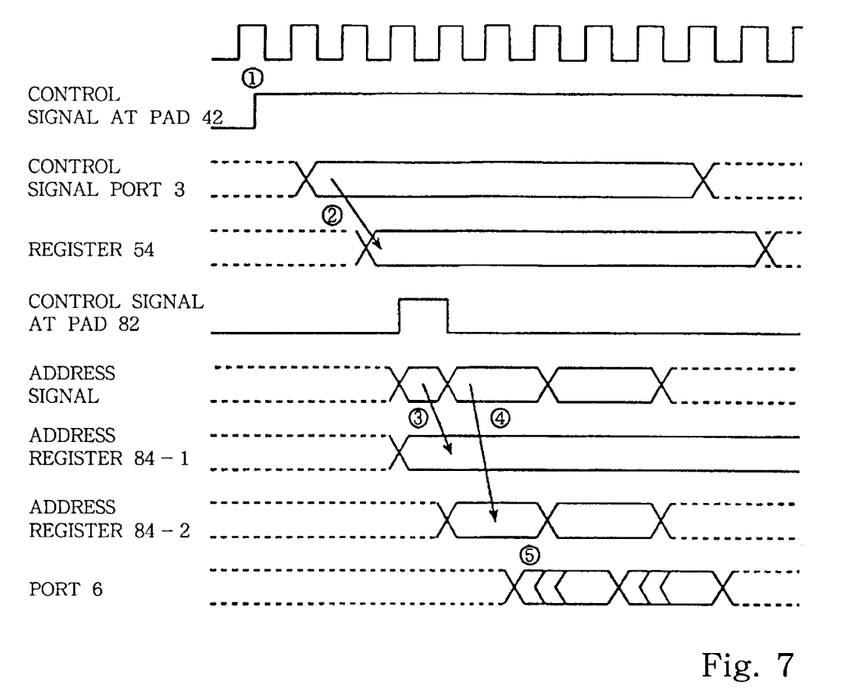
FIG. 7 is a timing chart showing a verification of the write-in test pattern.

Upon completion of the write-in, the external tester carries out the verification as shown in FIG. 7. The external tester changes the control signal at the test pad 42 to the high level as indicated by reference numeral 1 enclosed with a circle. The control signal makes the input/output ports PORT3 and PORT4 ready to receive the control signal and the address signal from the external tester, and the selectors 64-1 and 64-2 connect the sets of signal lines 98-1 and 98-2 to the address registers 84-1 and 84-2, respectively. The selector 92 connects the selector 90 to the data bus 76.

The external tester supplies the control signal indicative of the verify submode to the input/output port PORT3. The control signal is transferred through the selector 46, the set of signal lines 50 and the selector 52 to the register 54, and the control signal is stored in the register 54 as indicated by reference numeral 2 enclosed with a circle. The control signal is decoded, and the decoded signals are supplied to the EEPROM 36 and the input/output port PORT6. The verify sub-mode is established in the EEPROM 36, and the input/output port PORT6 is made ready to transfer the data signal to the external tester. The EEPROM 36 sets the threshold of a sense amplifier (not shown) to a predetermined level, and the output data port is enabled.

The external tester supplies the control signal at the communication pad 82 to the high level. The control signal is transferred to the selector 80, and the selector 80 connects the set of signal lines 68 to the set of signal lines 98-1. The external tester supplies the eight-bit address signal to the input/output port PORT4. The eight-bit address signal is transferred through the selector 60, the set of signal lines 68, the selector 80, the set of signal lines 98-1 and the selector 64-1 to the address register 84-1, and is stored thereinto as indicated by reference numeral 3 enclosed with a circle.

The external tester changes the control signal at the communication pad 82 to the low level. The control signal is transferred to the selector 80, and the selector 80 connects the set of signal lines 68 to the set of signal lines 98-2. The external tester supplies the eight-bit address signal to the input/output port PORT4. The eight-bit address signal is transferred through the selector 60, the set of signal lines 68, the selector 80, the set of signal lines 98-2 and the selector 64-2 to the address register 84-2, and is stored thereinto as indicated by reference numeral 4 enclosed with a circle. Thus, an address is stored in the address registers 84-1 and 84-2, and is supplied to the address port of the EEPROM 36.

The EEPROM connects the sense amplifier to the memory cells assigned the address through current paths, and the sense amplifier flows current through the current paths to the selected memory cells. The sense amplifier checks the potential levels on the current paths to see whether or not the selected memory cells discharge the current. If the memory cell discharges the current, the potential level on the associated current path becomes lower than the threshold. On the other hand, if the memory cell isolates the associated current path from a discharge line, the potential level exceeds the threshold. The sense amplifier determines the logic level of the test bits stored in the selected memory cells, and supplies an eight-bit data signal representative of read-out test patterns to the output data port.

The address register 84-2 supplies the lowest two bits to the selector 90 as the control signal, and the selector selectively connects the thirty-two output nodes of the output data port to the selector 92. The selector 92 transfers the eight-bit data signal through the data bus 76 to the input/output port PORT6, and in turn is transferred from the input/output port PORT6 to the external tester as indicated by reference numeral 5 enclosed with a circle. The external tester compares the read-out test pattern with the write-in test pattern, and diagnoses the memory cells. While the lowest two bits are from [00] to [11], the external tester checks the four test patterns read out from a selected word.

The external tester repeats the steps indicated by the reference numerals 4 and 5 respectively enclosed in circles, and increments the address by one. The read-out test patterns reach the four groups of output nodes. However, the selector 90 sequentially connects the four groups to the selector 92, and all the read-out test patterns are supplied through the input/output port PORT6 to the external tester.

When the lower part of the address reaches FFH, the external tester increments the higher part of the address by one, and repeats the steps indicated by the reference numerals 4 and 5 respectively enclosed in circles. Thus, the thirty-two test bits are divided into four groups, and are sequentially read out from the EEPROM 36 through the input/output data port PORT6 to the external tester. This results in reduction of communication pads 40 used for the verification.

Figure 8:
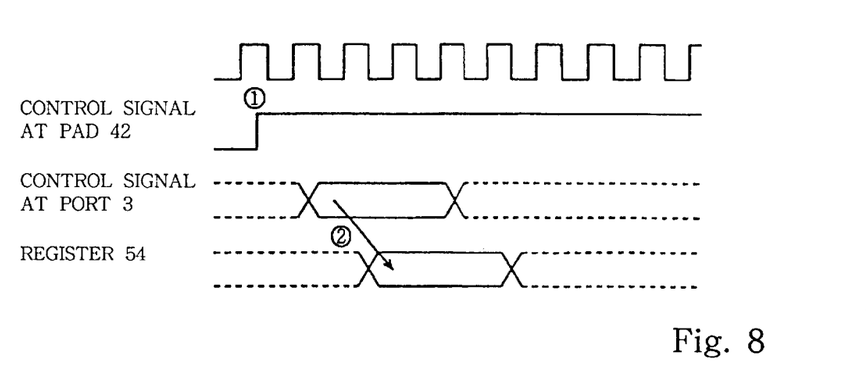
FIG. 8 is a timing chart showing an erasing.

Subsequently, the external tester erases the test pattern from the EEPROM 36. FIG. 8 illustrates the erasing operation. The external tester changes the control signal at the test pad 42 to the high level as indicated by reference numeral 1 enclosed in a circle. After establishing the test mode in the single chip microcomputer, the external tester supplies the control signal representative of the erasing sub-mode to the input/output port PORT3. The control signal is transferred to the register 54, and is stored therein as indicated by reference numeral 2 enclosed in a circle. The control signal is decoded, and the decoded signals establish the erasing sub-mode in the EEPROM 36. Then, the accumulated electrons are evacuated from the floating gates of the memory cells as a Fowler-Nordheim tunneling current.

After the erasing, the external tester repeats the verification to see whether or not the test pattern is erased from all the memory cells. When the erased state is confirmed, the external tester finishes the EEPROM test.

Figure 9:
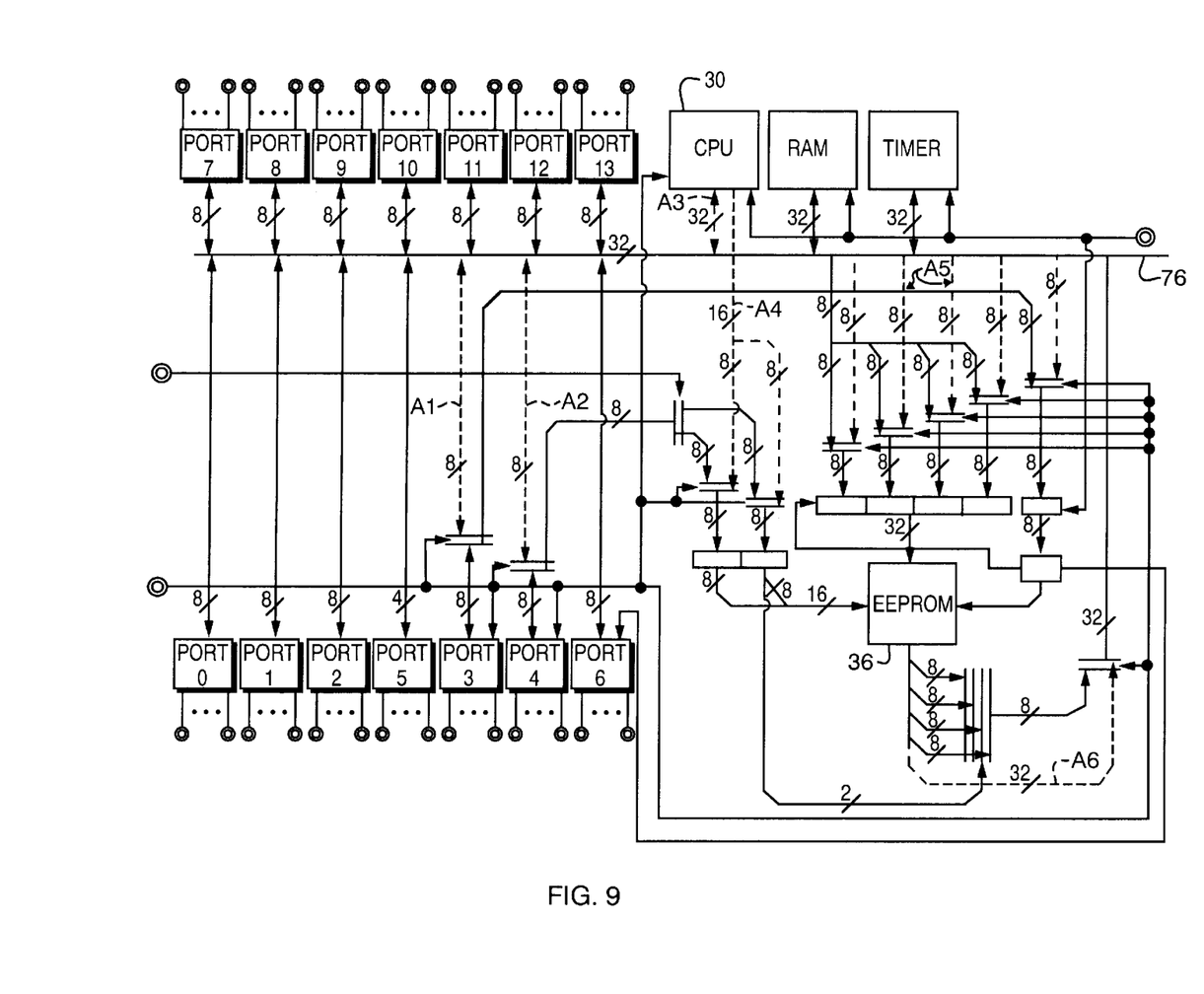
FIG. 9 is a block diagram showing signal paths of the single chip microcomputer in a data processing mode.

After the tests, the semiconductor wafer is separated into semiconductor chips, and the semiconductor chips are sealed in appropriate packages. The communication pads 40 are connected to signal pins. While the single chip microcomputer is operating in the data processing mode, the input/output data ports PORT3 and PORT4 are connected through 8-bit data paths indicated by gray arrows A1 and A2 to the data bus 76, respectively, the central processing unit 30 is connected to the data bus 76 through a 32-bit data path indicated by gray arrow A3 to the data bus 76 and through a 16-bit address path indicated by gray arrow A4 to the address port of the EEPROM 36, and 32-bit data paths indicated by gray arrows A5 and A6 are offered between the data bus 76 and the input data port/output data port of the EEPROM 36 as shown in FIG. 9. The single chip microcomputer behaves as similar to a standard single chip microcomputer in the data processing mode, and no further description is incorporated hereinbelow for the sake of simplicity.

Figure 10:
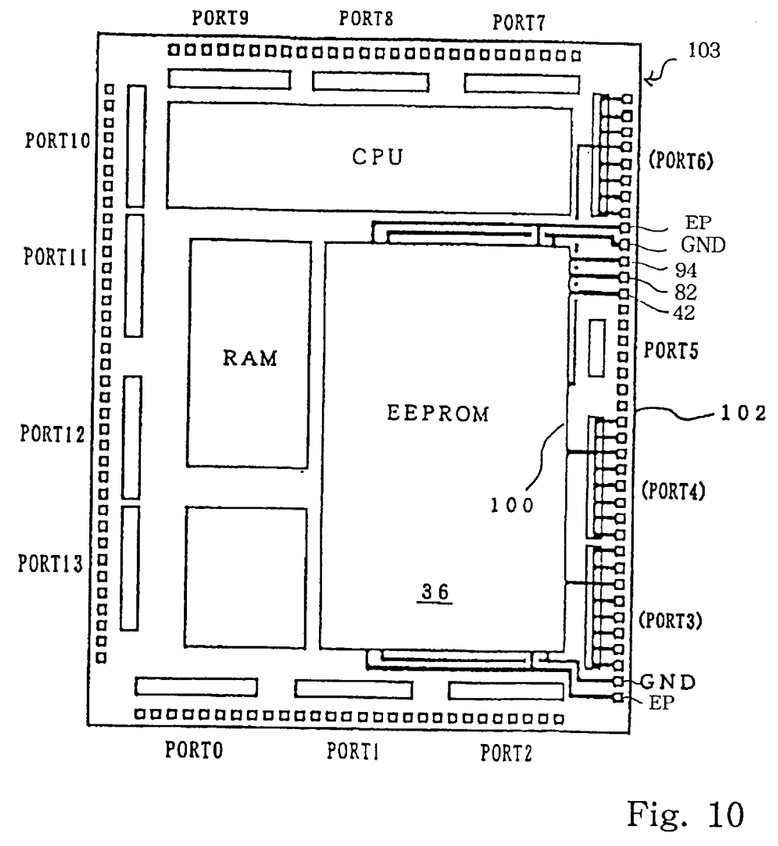
FIG. 10 is a plane view showing the layout of the components and the input/output ports of the single chip microcomputer.

FIG. 10 illustrates a layout of the components and the input/output ports PORT0 to PORT13. Electric power is supplied to the pads EP, and pads GND are connected to the ground. The test pad 42, the communication pad 82 and the input/output ports PORT3, PORT4 and PORT6 are arranged along an edge 102 of the semiconductor chip 103. The EEPROM 36 occupies a rectangular area, and the rectangular area has a long side line 100 in parallel to the edge 102. As a result, most of the pads 40, 42 and 82 used in the EEPROM test are connected to the components through short signal lines on the semiconductor chip 103, and the signals are propagated without serious delay.

Figure 11:
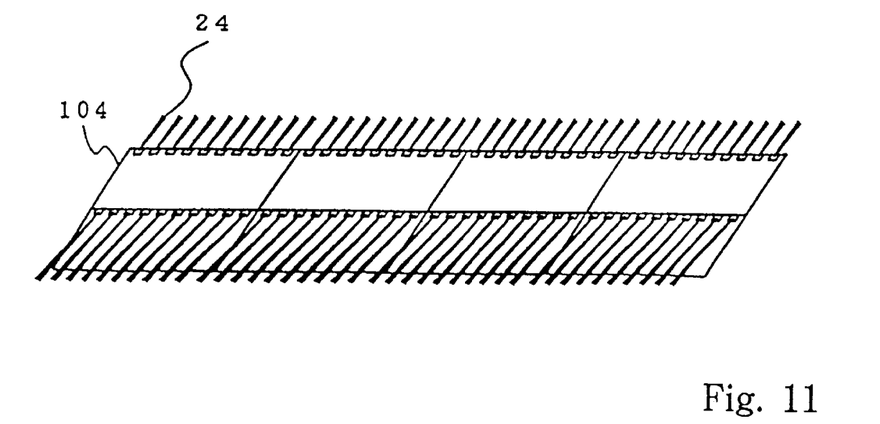
FIG. 11 is a perspective view showing a probe card used in a test for the EEPROM.

As will be appreciated from the foregoing description, the external tester concurrently communicates with the products 104 arranged in two rows on the semiconductor wafer through the probes 24 as shown in FIG. 11. The manufacturer completes the EEPROM test within half of the time period consumed in the prior art EEPROM test. As a result, the manufacturer reduces the cost of the EEPROM test.

Although particular embodiments of the present invention have been shown and described, it will be apparent to those skilled in the art that various changes and modifications may be made without departing from the spirit and scope of the present invention.

For example, another single chip microcomputer may have a data bus and an address bus instead of the shared bus 38.

The address signal may be divided into more than two address bit groups. In this instance, the communication pad 82 is replaced with a port having more than one pad.

Yet another single chip microcomputer may transfer the address bit groups at intervals, but the 32-bit data signals is transferred between a 32-bit data port and the data port of the EEPROM 36.

Still another single chip microcomputer may transfer data bits groups between the EEPROM 36 and the data port PORT6 at intervals, but the 16-bit address signal is directly supplied to the address port.

What is claimed is:

1. A single chip microcomputer fabricated on a semiconductor chip and having a data processing mode and a test mode, comprising:

a central processing unit executing programmed instructions expressing at least one job in said data processing mode;

an electrically erasable and programmable read only memory storing pieces of information used in said data processing mode for said central processing unit, and tested to see whether said pieces of information are properly maintained in said test mode;

plural communication pads classified into a first communication pad group used for said job in said data processing mode and a second communication pad group used for said job in said data processing mode and available for a test in said test mode and said communication pads being arranged along an edge of said semiconductor chip; and plural conductive paths selectively connected between said plural communication pads, said central processing unit and said electrically erasable and programmable read only memory, wherein said paths couple said first and second communication pad groups to said central processing unit in response to a control signal being inactive and wherein said paths couple said second communication pad groups to said electrically erasable and programmable read only memory in response to said control signal being active.

2. The single chip microcomputer as set forth in claim 1, in which said plural conductive paths include a first conductive path connected between a first sub-group of said second communication pad group and a data port of said electrically erasable and programmable read only memory in said test mode so as to transfer a first data signal representative of a write-in test pattern to be written into said electrically erasable and programmable read only memory to said data port and a second data signal representative of a read-out test pattern read out from said electrically erasable and programmable read only memory to said first sub-group, a second conductive path connected between a second sub-group of said second communication pad group and an address port of said electrically erasable and programmable read only memory in said test mode so as to transfer a first address signal representative of an address location where said test pattern is to be written to said address port, and a third conductive path connected between a third sub-group of said second communication pad group and a control port of said electrically erasable and programmable read only memory in said test mode so as to transfer a first control signal representative of instructions for said test to said control port.

3. The single chip microcomputer as set forth in claim 2, in which said electrically erasable and programmable read only memory occupies a rectangular area of said semiconductor chip having a pair of side lines substantially in parallel to said edge, and said first conductive path, said second conductive path and said third conductive path extend between said first, second and third sub-groups of said second communication pad group along said edge and one of the side lines of said pair.

4. The single chip microcomputer as set forth in claim 2, in which said plural conductive paths further includes a fourth conductive path serving as a shared bus, and said first conductive path has a first conductive sub-path connected between said first sub-group of said second communication pad group and said fourth conductive path and a second conductive sub-path connected between said fourth conductive path and said data port.

5. The single chip microcomputer as set forth in claim 2, in which said third conductive path has a register for storing said first control signal representative of said instructions and a decoder connected between said register and said control port so as to transfer said instructions to said electrically erasable and programmable read only memory device.

6. The single chip microcomputer as set forth in claim 2, in which said first sub-group, said second sub-group and said third sub-group are bi-directional signal ports further available for said data processing mode.

7. The single chip microcomputer as set forth in claim 6, in which said plural conductive paths further has a fourth conductive path serving as a shared bus, a fifth conductive path connected to said fourth conductive path for transferring a third data signal between said second sub-group and said fourth conductive path in said data processing mode, a sixth conductive path connected to said fourth conductive path for transferring a fourth data signal between said third sub-group and said fourth conductive path in said data processing mode, a seventh conductive path connected to said fourth conductive path for transferring a second address signal to said address port in said data processing mode, and an eighth conductive path connected to said fourth conductive path for transferring a second control signal representative of said instructions to said control port.

8. The single chip microcomputer as set forth in claim 7, in which said second conductive path has a first selector for selectively connecting said second sub-group to said second conductive path and said fifth conductive path and a second selector for selectively connecting said second conductive path and said seventh conductive path to said address port of said electrically erasable and programmable read only memory, and said third conductive path has a third selector selectively connecting said third sub-group to said third conductive path and said sixth conductive path and a fourth selector selectively connecting said third conductive path and said eighth conductive path to said control port of said electrically erasable and programmable read only memory.

9. The single chip microcomputer as set forth in claim 8, in which said second conductive pad group further has a fourth sub-group for transferring a third control signal indicative of one of said data processing mode and said test mode, and said first selector, said second selector, said third selector and said fourth selector are responsive to said third control signal so as to change conductive paths inside thereof depending upon the operation mode represented by said third control signal.

10. The single chip microcomputer as set forth in claim 9, in which said fourth selector selectively connects said third conductive line and said eighth conductive line to a register for storing one of said first and second control signals, and said register is connected through a decoder to said control port so as to decode said one of said first and second control signals into decoded signals representative of said instructions.

11. The single chip microcomputer as set forth in claim 10, in which one of said decoded signals is supplied to said first sub-group so as to selectively pass said first data signal and said second data signal.

12. The single chip microcomputer as set forth in claim 2, in which said first address signal is divided into plural address bit groups supplied from said first sub-group to said address port at intervals.

13. The single chip microcomputer as set forth in claim 12, in which said second conductive path has plural address registers for storing said plural address bit groups, respectively, and connected to said address port so as to supply said first address signal to said address port.

14. The single chip microcomputer as set forth in claim 13, in which said second conductive path further has a first selector connected between said second sub-group and said plural address registers, and said second communication pad group further has a fourth sub-group for transferring a second control signal to said first selector in said test mode so as to selectively connect said second sub-group to said plural address registers.

15. The single chip microcomputer as set forth in claim 14, in which said plural conductive paths further includes a fourth conductive path connected to said central processing unit for transferring a second address signal to said address port in said data processing mode, and said second conductive path further has plural second selectors responsive to a second control signal representative of an operation mode so as to selectively connecting said first selector and said fourth conductive path to said plural address registers depending upon said operation mode represented by said third control signal.

16. The single chip microcomputer as set forth in claim 2, in which said first conductive path has plural data registers arranged in parallel and connected to said data port of said electrically erasable and programmable read only memory, and said first data signal is concurrently supplied to said plural data registers so as to store said write-in test pattern in each of said plural data registers.

17. The single chip microcomputer as set forth in claim 16, in which said first conductive path further has a first selector connected to said data port and selectively connecting conductive nodes of said data port to said first sub-group.

18. The single chip microcomputer as set forth in claim 17, in which said plural conductive paths further has a fourth conductive path serving as a bus system, and said first conductive path further has a first conductive sub-path connected between said first sub-group and said fourth conductive path, plural second conductive sub-paths connected in parallel between said fourth conductive path and said plural data registers and a third conductive sub-path connected to said first selector for transferring said read-out test pattern through said fourth conductive path and said first conductive sub-path to said first sub-group.

19. The single chip microcomputer as set forth in claim 2, in which said first address signal is divided into plural address bit groups supplied from said first sub-group to said address port at intervals, and said first conductive path has plural data registers arranged in parallel and connected to said data port of said electrically erasable and programmable read only memory, and said first data signal is concurrently supplied to said plural data registers so as to store said write-in test pattern in each of said plural data registers.

20. The single chip microcomputer as set forth in claim 19, in which said first sub-group, said second sub-group and said third sub-group are further available for a data transfer in said data processing mode.

21. The single chip microcomputer as set forth in claim 20, in which said plural conductive paths further includes a fourth conductive path serving as an address bus for supplying a second address signal from said central processing unit to said address port, a fifth conductive path serving as a data bus, a sixth conductive path connected to said fourth conductive path for transferring a third data signal to said data port in said data processing mode, a seventh conductive path connected to said data port for transferring a fourth data signal from said data port in said data processing mode and an eighth conductive path connected to said fourth conductive path for transferring a fifth data signal in said data processing mode, said first conductive path further includes a first conductive sub-path connected between said first sub-group and said fourth conductive line, said plural data registers connected in parallel to said data port and each storing said write-in test pattern, a second conductive sub-path connected between said fourth conductive path and said plural data registers for concurrently supplying said first data signal to said plural data registers, first selectors selectively connecting said second conductive sub-path and said sixth conductive path to said plural data registers depending upon an operation mode, a second selector connected to said data port for selectively transferring said read-out test pattern from connecting conductive nodes of said data port, a third conductive sub-path connected to said fourth conductive path for selectively transferring said second data signal and said fourth data signal thereto and a third selector selectively connecting said second selector and said seventh conductive path to said third conductive sub-path depending upon said operation mode, and said second conductive path includes a first conductive sub-path for transferring said address bit groups at intervals, a fourth selector selectively connecting said second sub-group to said eighth conductive path and said first sub-path of said second conductive path depending upon said operation mode, plural address registers for storing said address bit groups, respectively, a fifth selector selectively connecting said first conductive sub-path of said second conductive path to output ports thereof and sixth selectors for selectively connecting said output ports of said fifth selector and said fourth conductive path to said plural registers depending upon said operation mode.

22. The single chip microcomputer as set forth in claim 1, in which said pieces of information represents said programmed instructions.

* * * * *